United States Patent
Whitcomb et al.

[19]

[11] Patent Number: 6,030,154
[45] Date of Patent: Feb. 29, 2000

[54] MINIMUM ERROR ALGORITHM/PROGRAM

[75] Inventors: Jonathan C. Whitcomb, Endicott; David E. Houser, Appalachin; Pamela Lulkoski, Vestal, all of N.Y.

[73] Assignee: International Business Machines Corporation, Armonk, N.Y.

[21] Appl. No.: 09/100,618

[22] Filed: Jun. 19, 1998

[51] Int. Cl.[7] ............................ B23B 35/00; G06F 19/00
[52] U.S. Cl. ...................................... 408/1 R; 364/474.15; 364/474.35; 382/151; 408/2; 408/3
[58] Field of Search .................................. 408/1 R, 2, 3, 408/16; 364/474.02, 474.15, 474.35; 382/151

[56] References Cited

U.S. PATENT DOCUMENTS

| | | |
|---|---|---|
| 3,859,711 | 1/1975 | McKiddy . |
| 4,110,594 | 8/1978 | May . |
| 4,790,694 | 12/1988 | Wilent et al. . |
| 4,791,586 | 12/1988 | Maeda et al. . |
| 4,799,175 | 1/1989 | Sano et al. . |
| 5,008,619 | 4/1991 | Keogh et al. . |
| 5,111,406 | 5/1992 | Zachman et al. .................. 408/16 |
| 5,280,437 | 1/1994 | Corliss . |
| 5,524,132 | 6/1996 | Ranadive . |
| 5,529,441 | 6/1996 | Kosmowski et al. . |
| 5,617,340 | 4/1997 | Cresswell et al. . |
| 5,699,282 | 12/1997 | Allen et al. . |

FOREIGN PATENT DOCUMENTS 7077417  3/1995  Japan .

*Primary Examiner*—Steven C. Bishop
*Attorney, Agent, or Firm*—Scully, Scott, Murphy & Presser

[57] ABSTRACT

A method and apparatus for optimizing the drilling position of a multi-layer printed circuit board prior to drilling. Each board is x-rayed to determine location coordinates information of the inner layers of multi layer circuit board panels. An optimization process determines optimal locations for drilling. The board is then drilled according to the optimized coordinates. By minimizing misregistration between the drilled holes and inner layers of the multi layer semiconductor circuit board, the present invention reduces a significant cause of scrap to the circuit board industry as well as removing a major impediment to further increasing circuit density and wireability.

30 Claims, 4 Drawing Sheets

MINIMUM ERROR ALGORITHM

MINIMUM ERROR ALGORITHM/PROGRAM

BACKGROUND OF THE INVENTION

1. Field of the Invention

The field of art to which this invention relates is the fabrication of semiconductor printed circuit boards. It is more particularly directed to drilling of multi layer printed circuit boards.

2. Description of Prior Art

Multi layer circuit boards are becoming increasingly more difficult to manufacture due to a continuing push toward greater functionality and increased wireability by shrinking line widths, line spacing, pad sizes, and drilled hole diameters. This increased density and complexity has placed greater demand on the ability of manufacturers to reduce registration tolerances.

In particular, a complex circuit board may be fabricated from a dozen or more individual circuitized cores which are stacked with dielectric in between and laminated together under heat and pressure. The alignment of these cores to each other and dimensional changes that occur during the core fabrication and under the heat and the pressure of the lamination, can result in significant misregistration of cores to each other and to their nominal or presumed location.

After lamination, holes are typically drilled and copper plated to form connections to desired inner layer circuits while avoiding connections to nearby undesired printed circuitry. Not only must the drill avoid any contact with an inner circuit where no connection is desired, it must also stay a safe distance away from those inner circuits, so that over years of use a conductive growth does not form to cause an electrical short. The dielectric immediately surrounding the drilled holes may be slightly damaged or fractured by drilling and a chemical attack, or the dielectric may have been slightly imperfect to begin with, necessitating a few thousandth of an inch safety margin.

It is thus a goal of circuit board manufacturer's to minimize the variability of the inner layer registration so that uniform drilling can be accomplished through all the through holes at their predetermined print locations. To achieve this goal, a method is sometimes employed to drill the first panel in a lot, get a general feel for errors between drilled holes and inner layers by looking at the panel with x-ray, and then drill the rest of the lot after making the correction determined from the x-ray picture of the first panel.

An improved method involves drilling a few holes in test areas and then looking at the panel with x-ray. In this procedure some information is gained prior to committing any panels to possible scrap.

Current methods for adjusting drilling for panel misregistrations involve inspecting every panel and adjusting the drills for every panel to match its particular misregistration. One such method is described in the U.S. Pat. No. 5,529,441 (Kosmowski et al.). Kosmowski et al. uses a beveled drill to gain optical access to inner layer targets, which are looked at and used to adjust the panel's position before drilling. The drawback of this method however, is the apparent inability to cleanly perform the bevel cut without smearing the inner layer of copper, and to get a good optical image to accurately measure the location of the revealed inner layer features, especially when those inner layer features are thin.

Furthermore, a regression fit of the location data gathered to optimize the panel position is used. The regression fit minimizes the sum of the squares of all the errors in the location data. If one layer among many is distinctly different from the rest, its errors are diluted by being averaged with all the other layers and the optimized panel position is not at all optimal for the rogue layer. If any of the layers are too misregistered and out of specification, the panel will be scrapped, so accommodating the majority of the layers while giving little aid to the worst layer will often result in scrap.

A second such method is described in the U.S. Pat. No. 4,790,694 (Wilent et al.). Wilent et al. uses overlapping targets on the internal planes. An X-ray is used to look at these targets, and the panel is translated and rotated and a new location system is formed in relation to these targets. Drilling is then performed conventionally with the panel pinned in registration to the new location system. The drawback with this method is that the reduction of error is decreased by the tolerance involved in creating the new location system. Additionally, layer to layer and panel to panel variation in scale i.e., shrinkage can be of similar magnitude to variation in the XY position and rotation. The panel shrinkage is not taken into account when the optimal translation and rotation are calculated. One corner of an inner layer in the board, which appears to be the worst registered and therefore heavily weighted in the optimization process would in fact turn out to be well registered and not a critical point of interest when shrinkage is also optimized. Whatever method is employed reducing such misregistrations, will remove a major impediment to further increasing circuit density, increasing wireability of designs, and decrease scrap waste, therefore it is of a significant interest to the printed circuit industry.

SUMMARY OF THE INVENTION

The present invention comprises a method for processing multi layer circuit boards with optimal registration between holes drilled through the board and circuits inside the board. The position of internal circuits is obtained using x-ray and the optional drill data, the nominal drill locations are adjusted to minimize the worst error between drill locations and internal circuits. Holes are subsequently drilled in the board at optimal locations.

A set of X and Y deviations from the nominal, or the print location for each inner layer target are created by a variety of methods. These data points are fed into a Minimum Error Process. The Minimum Error Process considers deviations in various parameters such as translation, rotation, and scaling factors with which the drill data could be corrected, and then looks for the best possible values of these parameters for drilling the panel.

The process does this by first hypothesizing moving drill location data in increments of possible combinations of parameters, i.e., positive and negative translation, rotation, and scaling. The resultant errors at these small increments of movement are calculated, and the one which gives the greatest reduction in the maximum error between the drill and inner layers is maintained. Again increments of translation, rotation, and scaling are hypothesized around this new position, and the process is repeated. When none of the increments gives a significantly reduced error the process is complete. The definition, of what error reduction is significant, can be based on a tradeoff between the calculation time and the number of decimal places with which to minimize the error.

In calculating the error for each data point, adjustments or weighting factors can be added in. This might be necessary to accommodate loss of drill registration from drill wander as the drill proceeds into the depth of the panel, or from a desire to constrain certain layers or areas in certain layers to a tighter registration criterion than others.

Advantageously, the method of this invention could be applied to other high precision location determination applications unrelated to the printed circuit board arts.

DETAILED DESCRIPTION OF THE INVENTION

Figure 1:
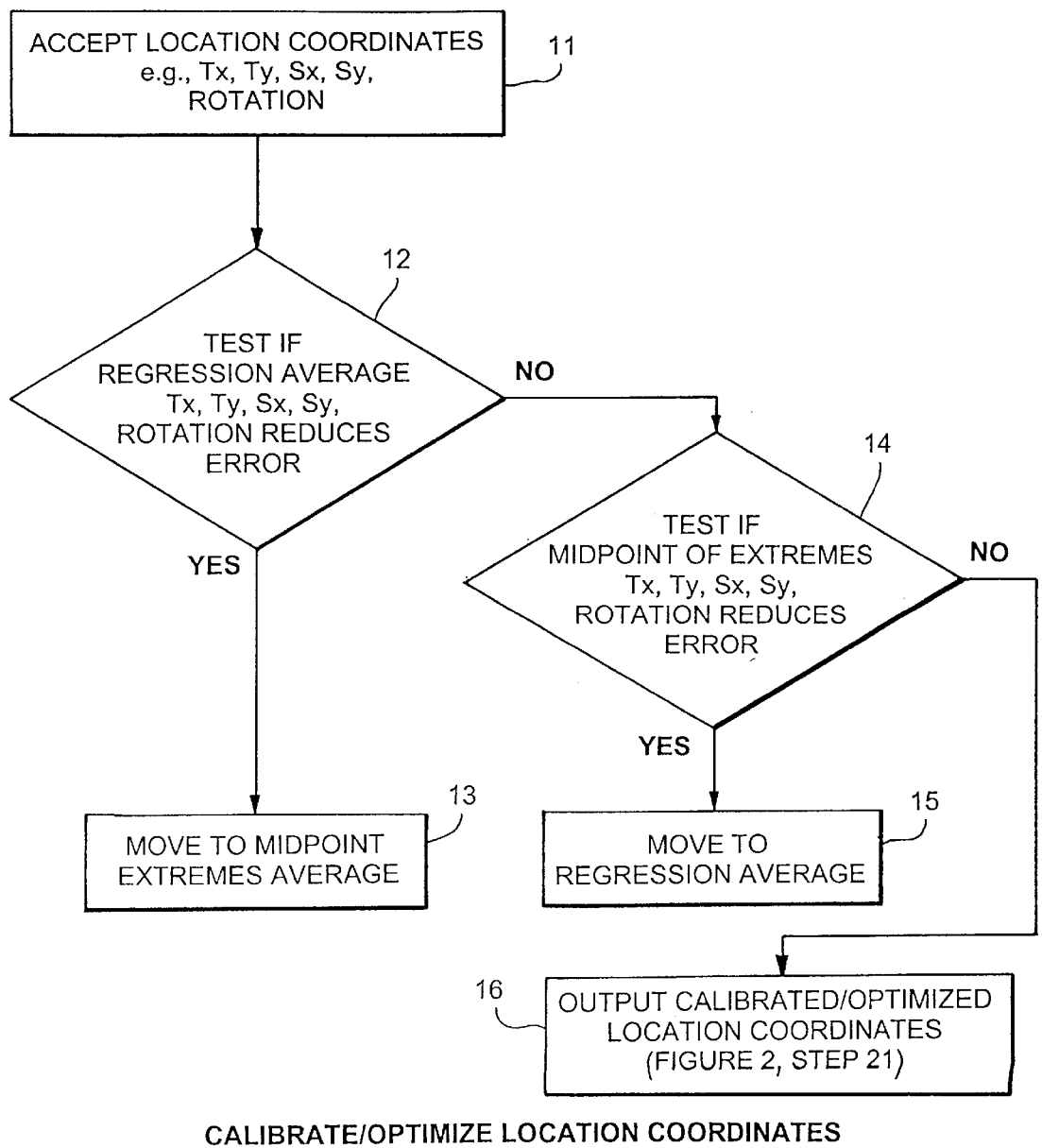
FIG. 1 is a flow diagram showing the steps for optimizing the input coordinates for the Minimum Error Process through the use of the regression and the midpoint of extremes averages.

As commonly practiced in the art and known to skilled artisans, targets are placed at multiple locations on each inner layer of the multi-layer circuit board.

Target positions preferably include a representation of locations around the periphery of the panel and number at least 4 and preferably at least 8. The target may be a dot, or a circle of copper, or it may be a clearance, or absence of copper in a larger area of copper. Each inner layer has a unique target location, which is clear of copper on all other layers so that during x-ray of the composite multi layer each inner layer's targets may be measured without interference from other layers.

The X and the Y are defined to be perpendicular axes in the plane of the circuit board. The preferred x-ray system has an accurate X-Y positioning system which will drive to the expected position of each target and measure the deviation of the target from its expected position. The positioning error of the panel in the x-ray machine is corrected for by using the x-ray to measure the position of the panel, locating features (preferably slots) relative to the x-ray machine, and correct all subsequent measurements for any error in panel placement on the machine.

In another embodiment, an x-ray system is employed to measure the relative location between the panel target and corresponding template hole. First, the panel is aligned to a template, or a mask, often by pins mating with slots in the panel. The template may have the pins affixed to it or, it may have a slot like the panel with both fitting on a pin fixture. The template has holes formed in it concentric with and usually larger than the panel targets. The template may be assumed to be a "golded" standard, or it may be measured on an accurate measuring machine and the target location data corrected for the inaccuracies in the template.

Either one of the systems described above creates a set of X and Y deviations from the nominal, or the print location, for each inner layer target, created by a variety of methods. From these X, Y deviation values, drill location data points are calculated and fed into a Minimum Error Process. The Minimum Error Process considers deviations in various parameters with which the drill data could be corrected. The parameters could be any algebraic expression, but those chosen preferably relate to typical error patterns found in the board inner layers. One such set of parameters would include X and Y translation, X and Y scale shrinkage/growth about the panel center, and rotation about the panel center. The process then looks for the best possible translation Tx, Ty, rotation, and scaling factors Sx, Sy, for drilling the panel.

In the preferred method of the present invention multi layer circuit panels are x-rayed prior to the drill operation. The X and Y location data is taken at a sampling of locations for each inner layer or some key subset of them. This information, along with current home location of a particular drilling machine to be used in the drill operation, is fed into a computer program to calculate the best new home location of the drilling machine, i.e., adjustments to the nominal drill position, and appropriate scaling factors for the drill pattern while optimizing registration between the drilled hole and inner layers.

A program is invoked on a computer system having at least one CPU, memory, disks, network connections, and computer peripherals such as but not limited to monitors, keyboards and printers. The program is adaptable to lights out automated operations i.e., it may work without operator interference, or it can run in the interactive mode where operator involvement is required. Through a user friendly interface the operator enters or provides input information such as part numbers, job numbers, machine(s) to be drilled on, the corresponding machine X and Y offsets. If the operation is proceeding in the automated mode all the information will be determined, collected and provided prior to the program invocation.

After accepting the input, the program passes nominal drill position coordinates to the Minimum Error Process. To reduce the calculation time, as shown in FIG. 1, after accepting coordinates in step 11, the process, in step 12, may perform initial checking of a regression fit of the translation, the rotation, and the shrinkage for all inner layer data points. If this point has lower maximum error than the nominal drill position coordinates, then at step 13, a substitution is made to replace the regression average values for original nominal drill position coordinates, an iteration is then begun from these points as described herein.

Similarly, to reduce the calculation time, the process, in step 14, checks the midpoint of extremes fit of the translation, the rotation, and the shrinkage factors. If this point has lower maximum error than the nominal drill position coordinates, then at step 15, a substitution is made to replace the midpoint of extremes coordinates for the drill positions presently used. This provides a way to leapfrog toward the optimal solution.

A minimum error calculation, rather than a regression fit, is necessary because the desire in locating the drilled holes is not to minimize their average error relative to the inner layers, but to make sure all holes are within the specification. For example, if one core, in a ten core multi layer panel is 0.008" shifted to the left and the other cores were near perfect, a regression fit would blend that cores data with the other nine cores and shift the drills 0.0008" to the left, leaving the rogue core with a 0.0072" error. Chances are that this core would now have a misregistration greater than allowable and the panel would be scrapped. With the minimum error calculation, the drilled holes would be shifted 0.004" to the left, and all the cores would have 0.004" error, which probably is acceptable.

Figure 2:
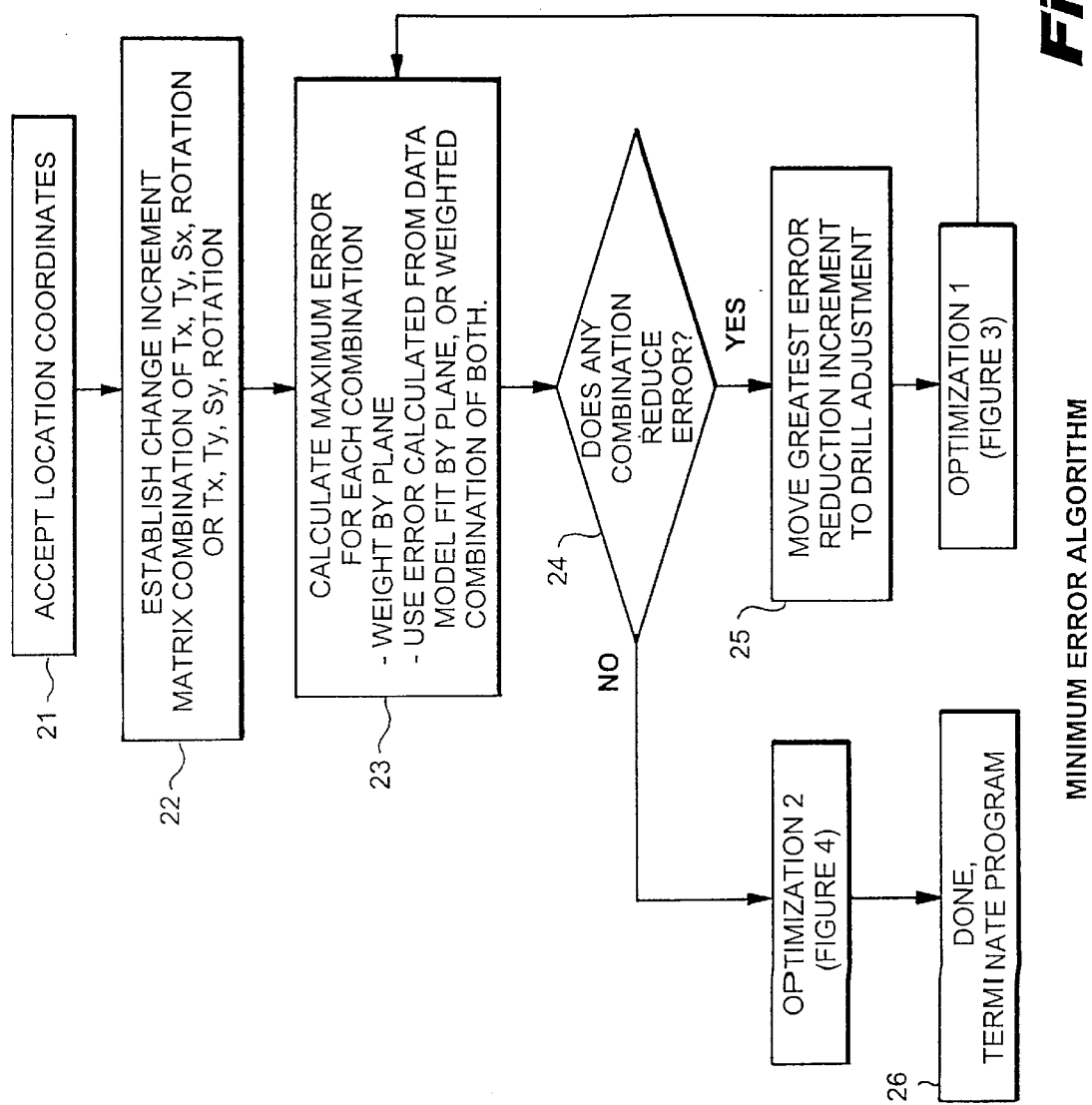
FIG. 2 is a flow diagram showing the steps of the Minimum Error Process.

FIG. 2 shows the logical flow of steps of the Minimum Error Process. After accepting new drill position coordinates in step 21, step 22 establishes change increment matrix combinations of drill position coordinates, e.g, current position coordinates incremented in different directions. Step 23 calculates the maximum error for each combination using the weight by plane. The error is calculated from the nominal drill position coordinates or from a model fit of these coordinates described above in connection with FIG. 1, or a weighted combination of both. Using error calculated from the nominal coordinates is generally preferred, however regression fit can be used to flag data points stemming from the rare gross mismeasurement at x-ray and flag the panel to be re-x-rayed. If a regression fit is used, it is only used to calculate the errors at each plane for input to the minimum error process. The change increment matrix not regression, is used to minimize the errors.

Step 24 examines error combinations calculated in step 23, in an attempt to find a lower error than previously discovered. If such combination is found, step 25 substitutes the best increment for nominal drill position coordinates. Coarser increments can be used in initial iterations, with finer increments employed when the coarser ones are no longer useful. Additionally, the last previously used incremental substitution can be reused if it provides any improvement, rather than searching for the optimal incremental substitution.

Figure 3:
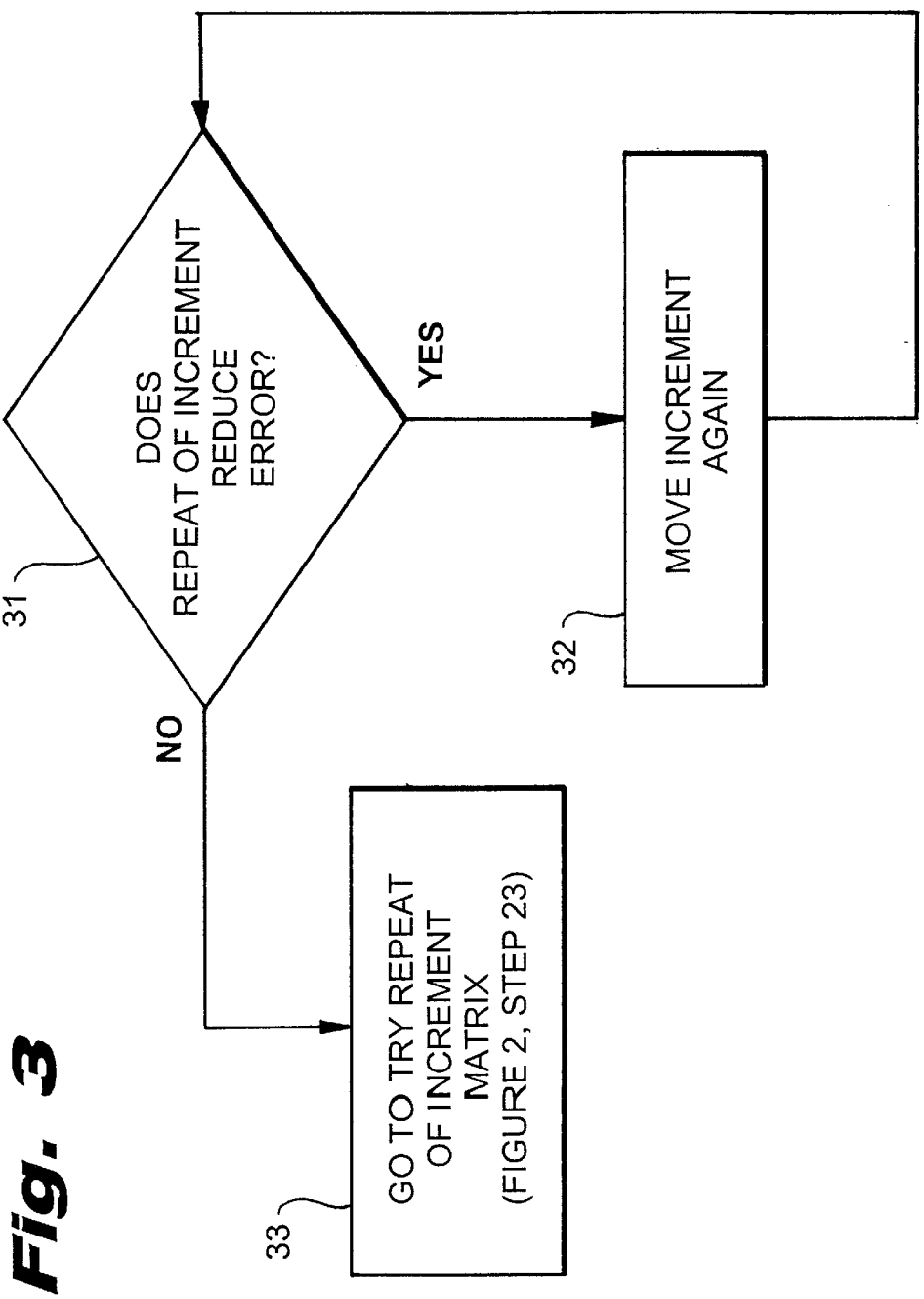
FIG. 3 is a flow diagram showing the steps for improvement of the increment of the matrix combination of the Minimum Error Process.

This optimization is shown in FIG. 3, where step 31 determines if a repeat of the increment is better. If the repeat of the increment is better, step 32 substitutes the increment for the present nominal drill position coordinates again and repeats step 31 until the repeat of the increment is no longer better. Step 33 returns control of the process to step 26 (FIG. 2), which repeats the increment matrix combination and returns the control of the program to step 23 (FIG. 2).

If a test of step 24 (FIG. 2) does not detect a better increment matrix combination calculated in step 23 (FIG. 2), the combinations of parameters may be reduced by holding one or more of these parameters constant while others are allowed to vary, and then allowing the previously constrained factor to vary while holding others constant. For instance, alternatively holding the X scale and then the Y scale constant may reduce the calculation time as opposed to allowing both the X scale and the Y scale to vary.

Figure 4:
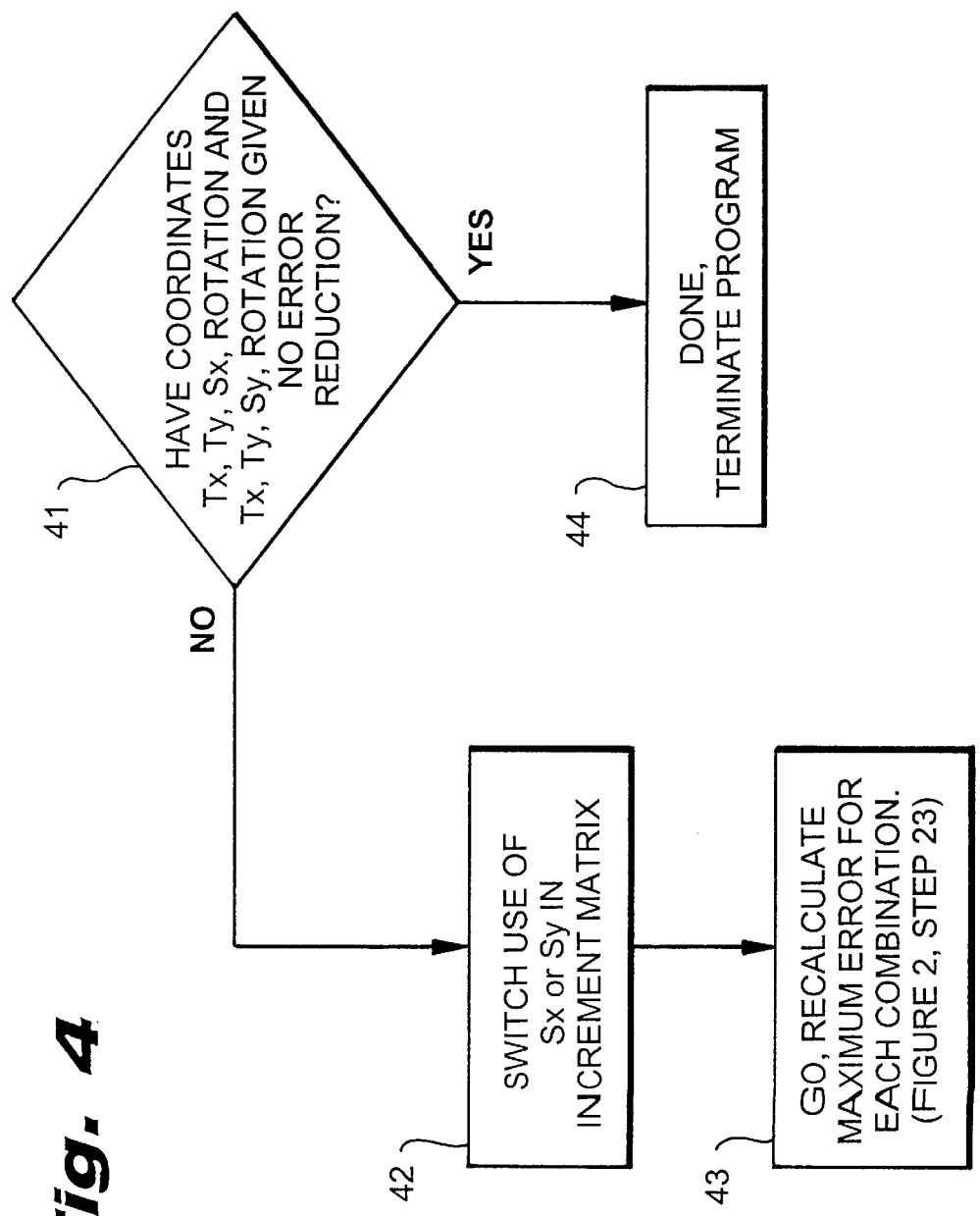
FIG. 4 is a flow diagram showing the steps for improving the matrix combination of the Minimum Error Process.

If step 22 (FIG. 2) established multiple increment matrix combinations, then optimization shown in FIG. 4 will further refine the parameters. First, a determination is made as to whether all parameter sets used have been exhausted. As indicated in step 41, two sets of parameters are being used, consisting of X and Y Translations, X Scale and Rotation, and of X and Y Translations, Y Scale and Rotation. If not all sets of parameters failed to reduce the maximum errors, step 42 varies coordinate parameters in increment matrix and returns the control of the program to step 43. Otherwise, step 44 terminates the process. A single parameter set may be used, however using more than one may reduce overall calculation time.

The drill position coordinates for a single station, preferably a single spindle drill machine, are then adjusted by the sum of the incremental moves, attained in calculating the minimum error, to enable drilling with optimal registration to the inner layers. Alternately, multiple station drill machines can be used, with multiple panels considered together in the optimization routine. Best practice in this case is to apply a well known grouping process to pick out panels with similar internal misregistrations to drill together on the same machine.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

Having thus described our invention, what we claim as new, and desire to secure by Letters Patent is:

1. A method for optimizing the registration of holes to be drilled relative to inner layers of multi-layer circuit board panels comprising:
   1) collecting location coordinates of inner layers of multi layer circuit board panels;
   2) calculating errors for combinations of adjustment increments to said location coordinates,
   3) selecting drilling adjustments from said combinations by iteratively incrementing said adjustment increments in a direction that results in maximum error reduction;
   4) locating drilling apparatus according to said drilling adjustments;
   5) drilling a hole in said multi layer circuit board panels according to said drilling adjustments; and
   6) utilizing a grouping process to decide which of said panels should be drilled together.

2. The method of claim 1, wherein said location coordinates are collected using x-ray.

3. The method of claim 2, wherein x-ray targets are staggered to be uniquely positioned for each inner layer.

4. The method of claim 1, wherein said step 2 further comprises the steps of:
   a. accepting said location coordinates and said drilling adjustments;
   b. establishing combinations of said adjustment increments to said location coordinates using a parameter set; and
   c. calculating the maximum error for each said combination using input parameters.

5. The method of claim 4, wherein said step 3 further comprises the steps of:
   d. testing said combinations of adjustment increments for a better error reduction; and
   e. selecting said combinations of adjustment increments for said drilling adjustments if the error reduction is better, and returning control to step d; and
   f. terminating the process if said error reduction tested in step d is not better.

6. The method of claim 5, where said input parameters are selected from the group consisting of a weight by plane, error calculated from data, model fit of the data, or a weighted combination of both.

7. The method of claim 5, wherein said drilling adjustments are calibrated if a regression fit average of said parameter set has lower error then the location coordinates.

8. The method of claim 5, wherein said drilling adjustments are calibrated if a midpoint of extremes of said parameter set has lower error then said location coordinates.

9. The method of claim 5, wherein said parameter set is selected from the group consisting of X translation, Y translation, X scale, Y scale, and rotation coordinates, or any subset of the group.

10. The method of claim 1, wherein drilling is accomplished by a single station single spindle drilling apparatus.

11. The method of claim 1, wherein drilling is accomplished by a multiple station drilling apparatus.

12. The method of claim 5, wherein step e further comprises:
   testing if repeating said combinations of adjustment increments improves said error reduction;
   calibrating said drilling adjustments if said error reduction improves; and returning control to step c, if the error reduction of said combinations of adjustment increments is not improved.

13. The method of claim 5, wherein a single combination of adjustments increments is established.

14. The method of claim 5, wherein multiple combination of adjustment increments are established.

15. The method of claim 14, wherein step f further comprises:

testing each of the multiple combinations of adjustment increments;

terminating the process if all combinations of adjustment increments have given no improvement;

modifying said combination of adjustment increments if improvement was given; and returning control to step c.

16. A computer program device readable by a machine, tangibly embodying a program of instructions executable by a machine to perform method steps for optimizing the registration of holes to be drilled relative to inner layers of multi layer circuit board panels, said method steps comprising:

1) collecting location coordinates of inner layers of multi layer circuit board panels;

2) calculating errors for combinations of adjustment increments to said location coordinates, 3) selecting drilling adjustments from said combinations by iteratively incrementing said adjustment increments in a direction that results in maximum error reduction;

4) locating drilling apparatus according to said drilling adjustments;

5) drilling a hole in said multi layer circuit board panels according to said drilling adjustments; and 6) utilizing a grouping process to decide which panels should be drilled together.

17. The computer program device of claim 16, wherein said location coordinates are collected using x-ray.

18. The computer program device of claim 17, wherein x-ray targets are staggered to be uniquely positioned for each inner layer.

19. The computer program device of claim 16, wherein said step 2 further comprises the steps of:

a. accepting said location coordinates and said drilling adjustments;

b. establishing combinations of said adjustment increments to said location coordinates using a parameter set; and c. calculating the maximum error for each said combination using input parameters.

20. The computer program device of claim 19, wherein said step 3 further comprises the steps of:

d. testing said combinations of adjustment increments for a better error reduction; and e. selecting said combinations of adjustment increments for said drilling adjustments if the error reduction is better, and returning control to step d; and f. terminating the process if said error reduction tested in step d is not better.

21. The computer program device of claim 20, where said input parameters are selected from the group consisting of a weight by plane, error calculated from data, model fit of the data, or a weighted combination of both.

22. The computer program device of claim 20, wherein said drilling adjustments are calibrated if a regression fit average of said parameter set has lower error then the location coordinates.

23. The computer program device of claim 20, wherein said drilling adjustments are calibrated if a midpoint of extremes of said parameter set has lower error then said location coordinates.

24. The computer program device of claim 20, wherein said parameter set is selected from the group consisting of X translation, Y translation, X scale, Y scale, and rotation coordinates, or any subset of the group.

25. The computer program device of claim 16, wherein drilling is accomplished by a single station single spindle drilling apparatus.

26. The computer program device of claim 16, wherein drilling is accomplished by a multiple station drilling apparatus.

27. The computer program device of claim 20, wherein step e further comprises:

testing if repeating said combinations of adjustment increments improves said error reduction;

calibrating said drilling adjustments if said error reduction improves; and returning control to step c, if the error reduction of said combinations of adjustment increments is not improved.

28. The computer program device of claim 20, wherein a single combination of adjustments increments is established.

29. The computer program device of claim 20, wherein multiple combination of adjustment increments are established.

30. The computer program device of claim 29, wherein step f further comprises:

testing each of the multiple combinations of adjustment increments;

terminating the process if all combinations of adjustment increments have given no improvement;

modifying said combination of adjustment increments if improvement was given; and returning control to step c.

* * * * *

UNITED STATES PATENT AND TRADEMARK OFFICE
CERTIFICATE OF CORRECTION

PATENT NO. : 6,030,154
DATED : February 29, 2000
INVENTOR(S) : Jonathan C. Whitcomb, et al.

It is certified that error appears in the above-identified patent and that said Letters Patent is hereby corrected as shown below:

Title page, item [56], References Cited, FOREIGN PATENT DOCUMENTS:

Insert --GB 2311618 A 10/1997 United Kingdom--

Signed and Sealed this

Sixth Day of February, 2001

*Attest:*

Q. TODD DICKINSON

*Attesting Officer*  Director of Patents and Trademarks